United States Patent [19]

Tanei

[11] Patent Number: 5,773,992
[45] Date of Patent: Jun. 30, 1998

[54] OUTPUT BUFFER CIRCUIT CAPABLE OF SUPRESSING RINGING

[75] Inventor: Yoshimasa Tanei, Tokyo, Japan

[73] Assignee: NEC Corporation, Japan

[21] Appl. No.: 730,501

[22] Filed: Oct. 11, 1996

[30] Foreign Application Priority Data

Oct. 13, 1995 [JP] Japan .................................. 7-265410

[51] Int. Cl.$^6$ ............................................. H03K 19/003
[52] U.S. Cl. ............................. 326/27; 326/83; 327/103; 327/312
[58] Field of Search .................................. 327/180, 309, 327/310, 312, 103; 326/26–28, 83, 86

[56] References Cited

U.S. PATENT DOCUMENTS

| | | |
|---|---|---|
| 5,233,238 | 8/1993 | Mattos ...................................... 326/27 |
| 5,283,478 | 2/1994 | Maloberti et al. ................... 327/103 X |
| 5,359,298 | 10/1994 | Abe .............................................. 331/2 |
| 5,430,388 | 7/1995 | Hall et al. .................................. 326/27 |
| 5,514,979 | 5/1996 | Collins et al. ............................. 326/27 |
| 5,550,495 | 8/1996 | Fotouhi ................................... 327/103 |
| 5,617,051 | 4/1997 | Bingham ............................... 326/27 X |

*Primary Examiner*—David R. Hudspeth
*Attorney, Agent, or Firm*—Ostrolenk, Faber, Gerb & Soffen, LLP

[57] ABSTRACT

An output buffer circuit includes, a voltage-to-current conversion circuit for converting a voltage at an output terminal into a first current supplied from a first power supply terminal, a current-to-current conversion circuit for converting the first current into a second current flowing between the output terminal and a second power supply terminal, and a control circuit for turning ON and OFF said current-to-current circuit in accordance with an input voltage at an input terminal.

8 Claims, 14 Drawing Sheets

PRIOR ART

PRIOR ART

OUTPUT BUFFER CIRCUIT CAPABLE OF SUPRESSING RINGING

BACKGROUND OF THE INVENTION

1. Field of the Invention

The present invention relates to an output buffer circuit connectable to a small computer system interface (SCSI) cable.

2. Description of the Related Art

A prior art output buffer circuit of an open drain output type output buffer circuit is comprised of an N-channel MOS transistor having a gate connected to an input terminal, a drain connected to an output terminal, and a source connected to a ground terminal. Also, a SCSI cable is connected to the output terminal of the output buffer circuit. In this case, terminal resistors are connected to each end of the SCSI cable. Further, in accordance with the SCSI standard, the gate width/gate length of the transistor must be sufficiently large. This will be explained later in detail.

In the above-mentioned prior art open drain type output buffer circuit, however, when the transistor is turned ON, an instantaneously large current appears in a sink current flowing through the transistor. This large current affects the output voltage. That is, a counter electromotive force due to the instantaneously large sink current makes the output voltage ring. This ringing phenomenon propagates error signals on the SCSI cable, which is a large problem in high speed data transfer for large capacity data.

A prior art output buffer of a tri-state type is comprised of a P-channel MOS transistor and an N-channel MOS transistor connected between a power supply terminal and a ground terminal. Also, in accordance with the SCSI standard, the gate width/gate length of each transistor must be sufficiently large. This will also be explained later in detail.

Even in the above-mentioned prior art tri-state output buffer circuit, when the N-channel transistor is turned ON, an instantaneously large current appears in a sink current flowing through the N-channel transistor, in the same way as in the open drain type output buffer circuit. In addition, when the P-channel transistor is turned ON, an instantaneously large current appears in a drive current flowing through the P-channel transistor. These large currents affect the output voltage. That is, a counter electromotive force due to the instantaneously large currents makes the output voltage ring. This ringing phenomenon propagates error signals on the SCSI cable, which is also a large problem in high speed data transfer for large capacity data.

SUMMARY OF THE INVENTION

It is an object of the present invention to suppress the ringing phenomenon in an output voltage of an output buffer circuit connectable to a SCSI cable.

According to the present invention, an output buffer circuit includes a voltage-to-current conversion circuit for converting a voltage at an output terminal into a first current supplied from a first power supply terminal, a current-to-current conversion circuit for converting the first current into a second current flowing between the output terminal and a second power supply terminal, and a control circuit for turning ON and OFF said current-to-current circuit in accordance with an input voltage at an input terminal.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art output buffer circuits will be explained with reference to FIGS. 1, 2, 3A, 3B, 3C, 4, 5A, 5B, 6A, 6B, 6C and 6D.

Figure 1:
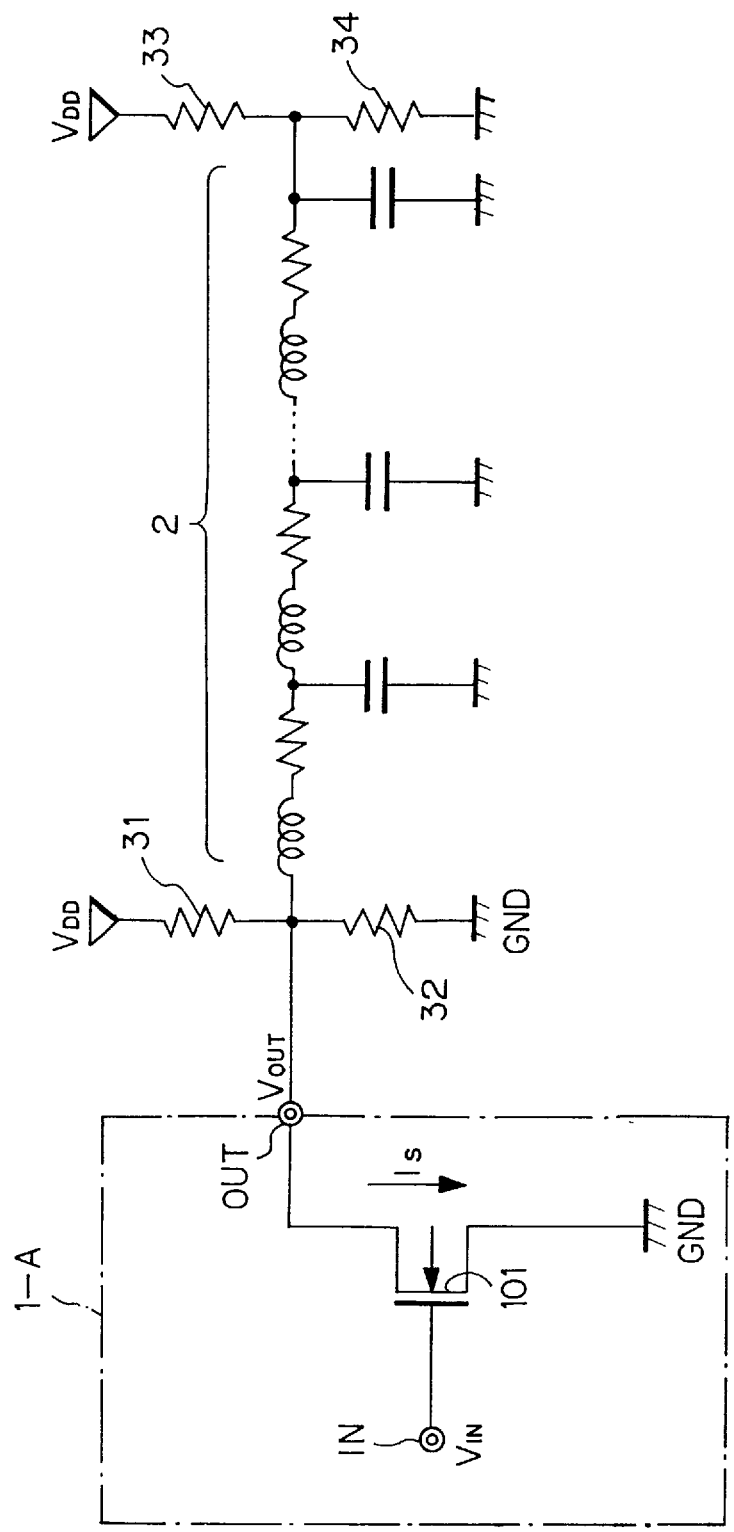
FIG. 1 is a circuit diagram illustrating a first prior art output buffer circuit.

In FIG. 1, which illustrates a first prior art output buffer circuit, an open drain output type output buffer circuit 1-A is provided. That is, the output buffer circuit 1-A is comprised of an N-channel MOS transistor 101 having a gate connected to an input terminal IN, a drain connected to an output terminal OUT, and a source connected to a ground terminal.

A SCSI cable 2 is connected to the output terminal OUT of the output buffer circuit 1-A. In this case, terminal resistors 31 and 32 are connected to one end of the SCSI cable 2, and terminal resistors 33 and 34 are connected to the other end of the SCSI cable 2.

Figure 2:
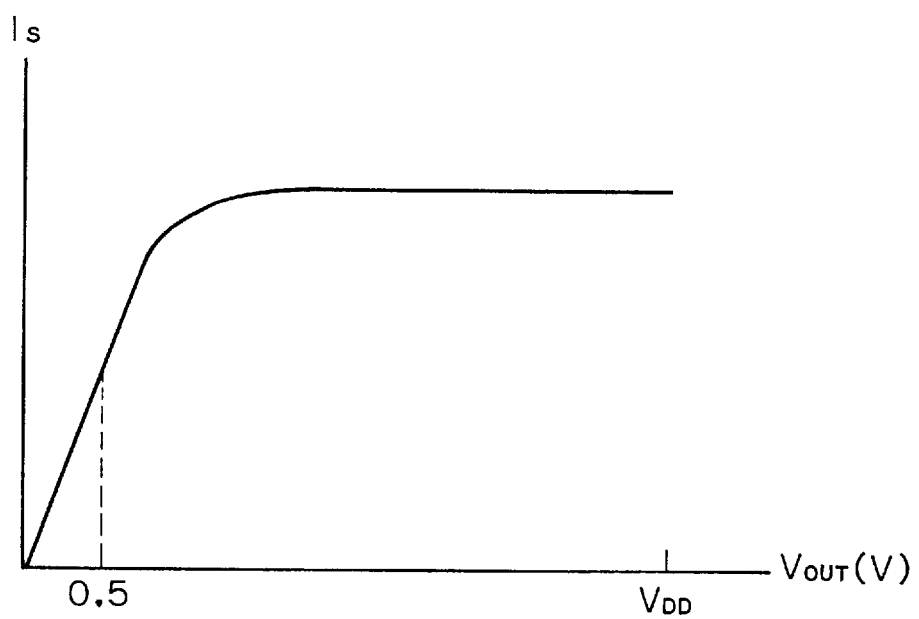
FIG. 2 is a graph showing an example of the output voltage to sink current characteristics of the transistor of FIG. 1.

In accordance with the SCSI standard, when an output voltage $V_{OUT}$ at the output terminal OUT is 0.5V, a sink current $I_S$ flowing through the transistor 101 is required to be not smaller than 48 mA. Generally, an example of output voltage to sink current characteristics of the transistor 101 is shown in FIG. 2. For realizing this, the transistor 101 has to be sufficiently large in scale; for example, its gate width/gate length is 2000 to 3000 $\mu$m/1 $\mu$m.

The operation of the output buffer circuit 1-A of FIG. 1 is explained next with reference to FIGS. 3A, 3B and 3C.

Figure 3A:
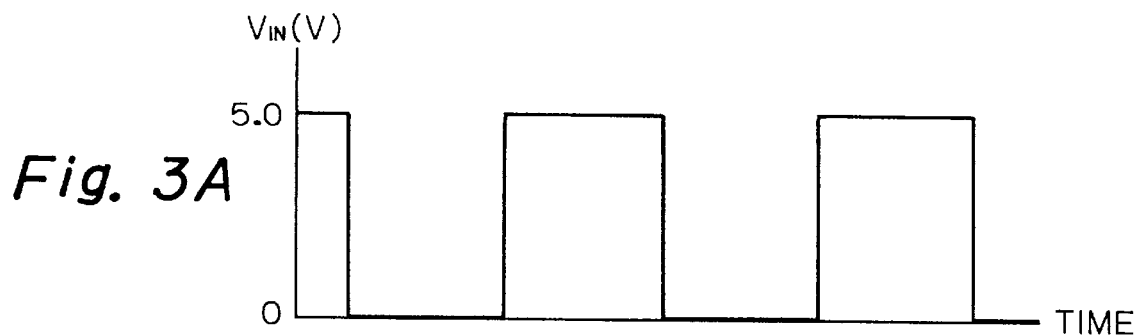
FIGS. 3A, 3B and 3C are graphs showing the operation of the output buffer circuit of FIG. 1.
Figure 3B:
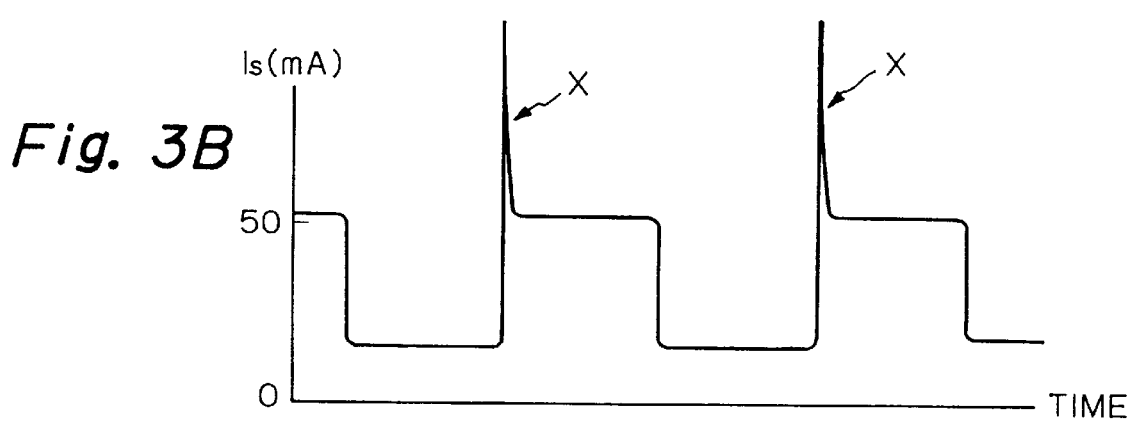

When an input voltage $V_{IN}$ at the input terminal IN is changed as shown in FIG. 3A, an instantaneously large current indicated by X in FIG. 3B appears in the sink current $I_S$ flowing though the transistor 101 due to the small ON resistance thereof. Such a large sink current $I_S$ is represented by $$I_S = C \cdot dV_{OUT}/dt \quad (1)$$

where C is an equivalent capacitance of the SCSI cable 2. Therefore, if the equivalent capacitance C is 200 pF, a power supply voltage $V_{DD}$ is 5V, and a through rate of the output voltage $V_{OUT}$ is 5 ns, then, $$\begin{aligned} I_S &= 200 \times 10^{-12} \times 5/(5 \times 10^{-9}) \\ &= 200 \text{ mA} \end{aligned}$$

Figure 3C:
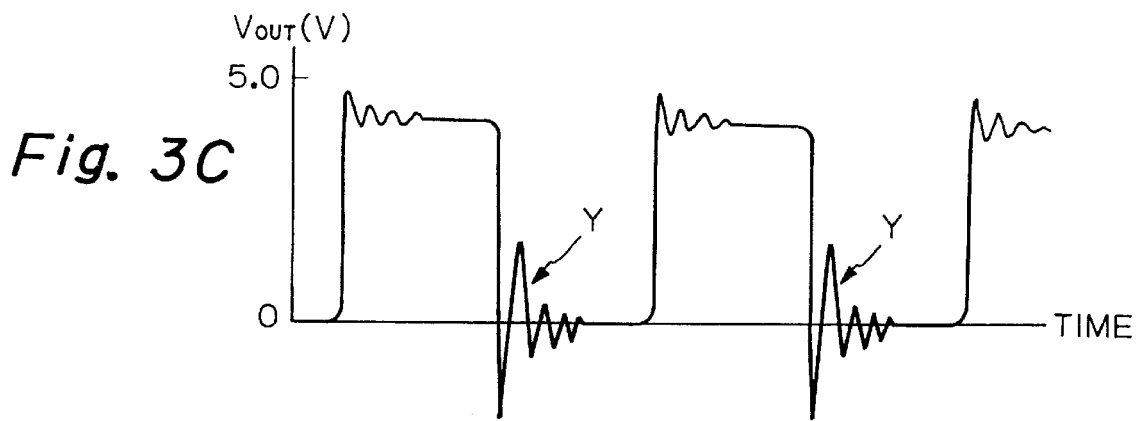

The large sink current $I_S$ as indicated by X in FIG. 3B affects the output voltage $V_{OUT}$ as shown in FIG. 3C. That is, a counter electromotive force due to the spontaneously large sink current $I_S$ makes the output voltage $V_{OUT}$ ring as indicated by Y in FIG. 3C. In this case, the counter electromotive force V is represented by $$V = -L dI/dt \quad (2)$$

where L is an inductance of the SCSI cable 2. Therefore, if L is 10 nH and the through rate of the output voltage $V_{OUT}$ is also 5 ns, then, $$\begin{aligned} V &= -10 \times 10^{-9} \times 200 \times 10^{-3}/(5 \times 10^{-9}) \\ &= -0.4 \text{ V} \end{aligned}$$

This ringing phenomenon as indicated by Y in FIG. 3C propagates error signals on the SCSI cable 2, which is a large problem in high speed data transfer for large capacity data.

Figure 4:
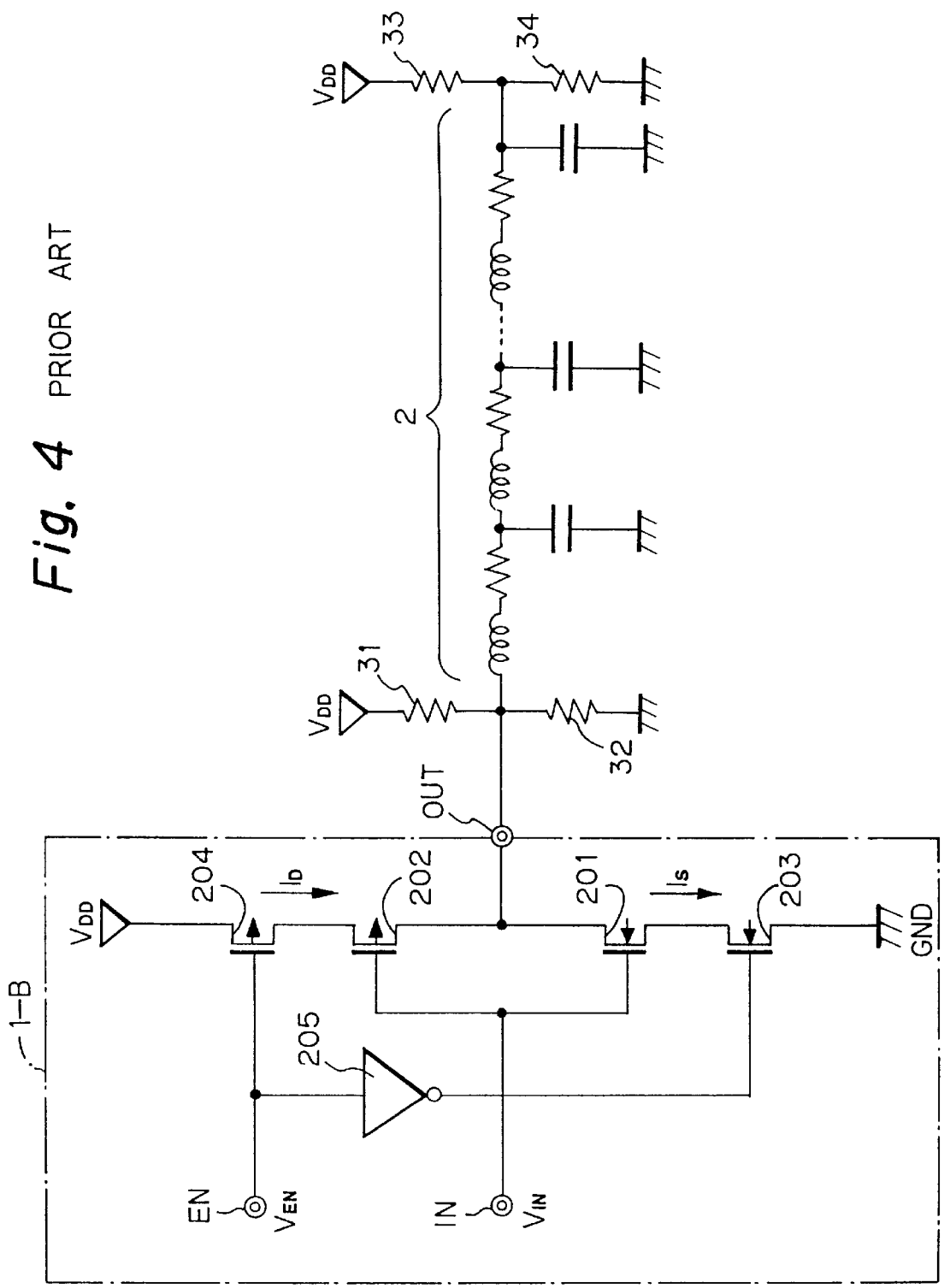
FIG. 4 is a circuit diagram illustrating a second prior art output buffer circuit.

In FIG. 4, which illustrates a second prior art output buffer circuit, a tri-state type output buffer circuit 1-B is provided. That is, an enable terminal EN is provided. Also, the output buffer circuit 1-B is comprised of an N-channel MOS transistor 201 corresponding to the transistor 101 of FIG. 1, a P-channel MOS transistor 202, an N-channel MOS transistor 203, a P-channel MOS transistor 204, and an inverter 205. The transistors 201 and 202 are controlled by the input voltage $V_{IN}$, and the transistors 203 and 204 are controlled by an enable voltage $V_{EN}$ at the enable terminal EN.

Figure 5A:
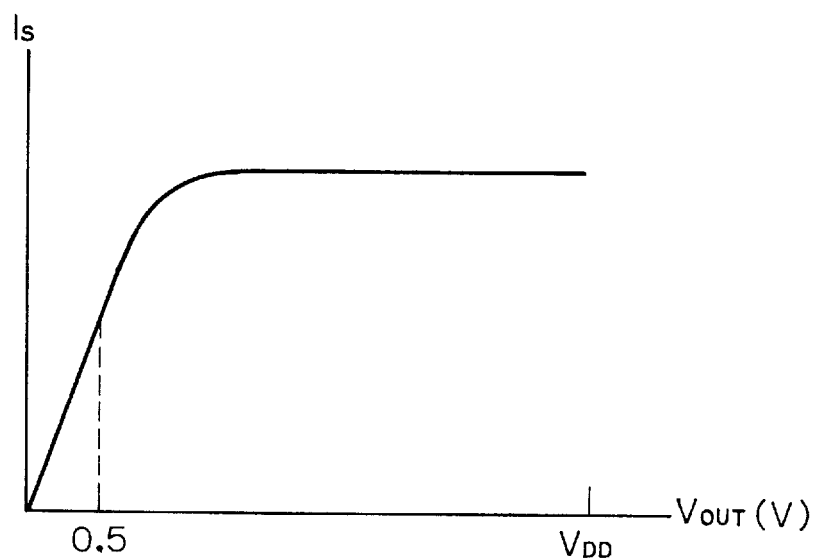
FIG. 5A is a graph showing an example of the output voltage to sink current characteristics of the N-channel transistor of FIG. 4.

Also, in accordance with the SCSI standard, when the output voltage $V_{OUT}$ at the output terminal OUT is 0.5V, the sink current $I_S$ flowing through the transistor 201 is required to be not smaller than 48 mA. Generally, an example of output voltage to sink current characteristics of the transistor 201 where the transistor 203 is turned ON is as shown in FIG. 5A. For this purpose, the transistor 201 as well as the transistor 203 has to be sufficiently large in scale; for example, its gate width/gate length is 2000 to 3000 $\mu$m/1 $\mu$m.

Figure 5B:
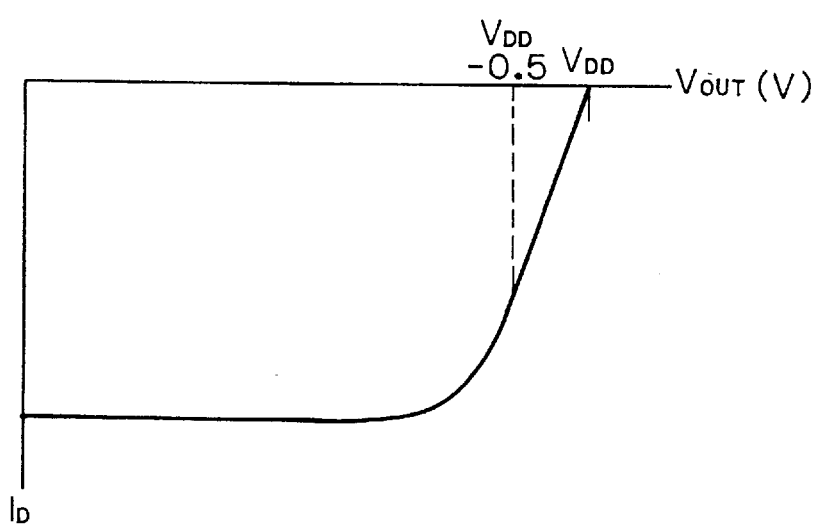
FIG. 5B is a graph showing an example of the output voltage to drive current characteristics of the P-channel transistor of FIG. 4.

Similarly, when the output voltage $V_{OUT}$ at the output terminal OUT is high, for example, $V_{DD}$–0.5V, a drive current $I_D$ flowing through the transistor 202 is required to be large for charging the capacitance of the SCSI cable 2. Generally, an example of output voltage to drive current characteristics of the transistor 202 where the transistor 204 is turned ON is shown in FIG. 5B. For this purpose, the transistor 202 as well as the transistor 204 has to be sufficiently large in scale.

The operation of the output buffer circuit 1-B of FIG. 4 is explained next with reference to FIGS. 6A, 6B, 6C and 6D.

Figure 6A:
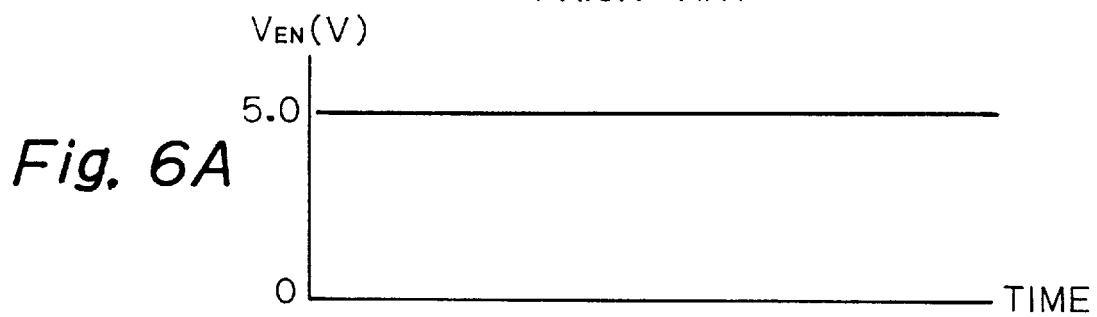
FIGS. 6A, 6B, 6C and 6D are graphs showing the operation of the output buffer circuit of FIG. 4.

As shown in FIG. 6A, assume that an enable signal $V_{EN}$ at the enable terminal EN is $V_{DD}$ (=5V).

Figure 6B:
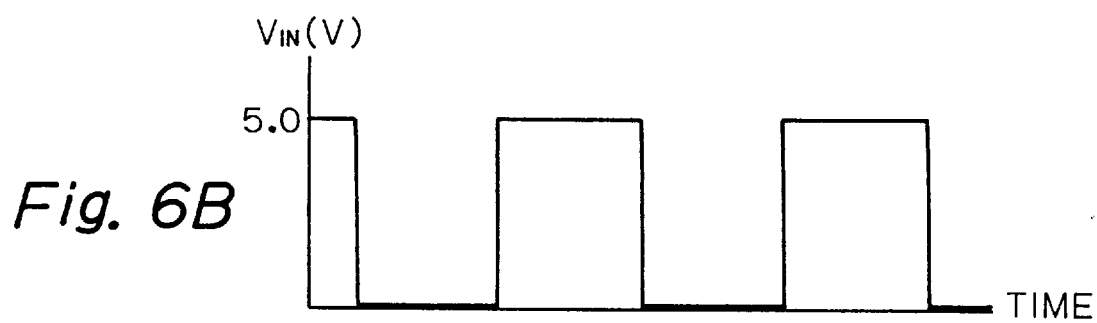
Figure 6C:
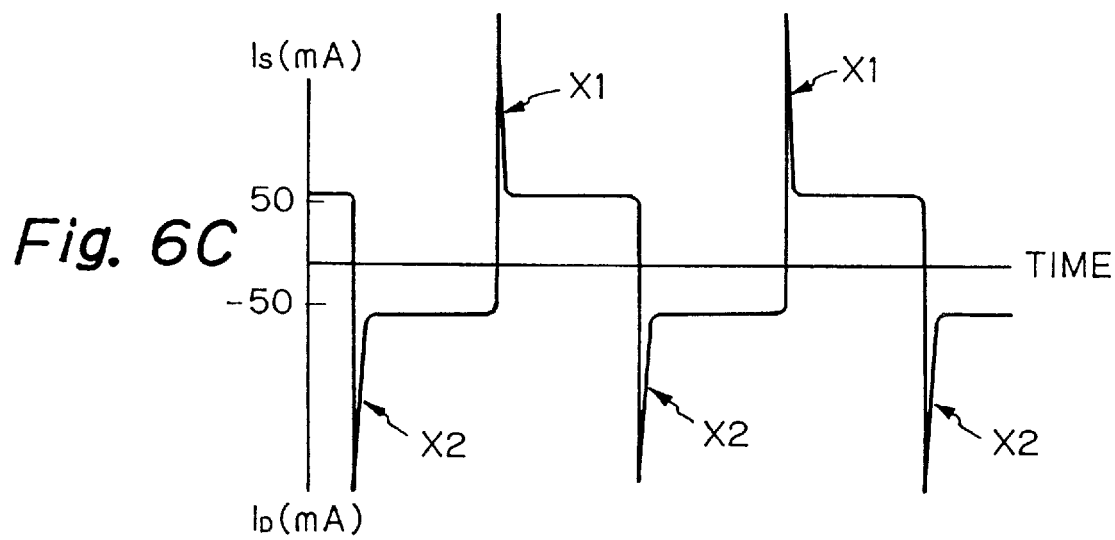
Figure 6D:
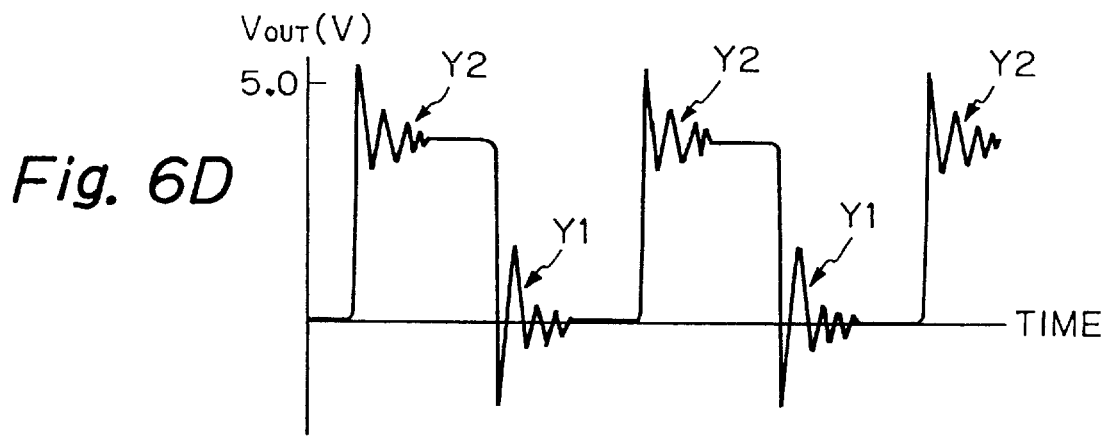

When the input voltage $V_{IN}$ at the input terminal IN is changed as shown in FIG. 6B, an instantaneously large current indicated by X1 in FIG. 6C appears in the sink current $I_S$ flowing though the transistor 201 due to the small ON resistance thereof. Such a large sink current $I_S$ is, for example, 200 mA, in the same way as in the output buffer circuit 1-A of FIG. 1. Also, the large sink current $I_S$ as indicated by X1 in FIG. 6C affects the output voltage $V_{OUT}$ as shown in FIG. 6D. That is, the output voltage $V_{OUT}$ rings as indicated by Y1 in FIG. 6D.

Simultaneously, an instantaneously large current indicated by X2 in FIG. 6C appears in the drive current $I_D$ flowing though the transistor 202 due to the small ON resistance thereof. Such a large drive current $I_D$ is, also, 200 mA. This large drive current $I_D$ as indicated by X2 in FIG. 6C also affects the output voltage $V_{OUT}$ as shown in FIG. 6D. That is, the output voltage $V_{OUT}$ rings as indicated by Y2 in FIG. 6D.

The ringing phenomenon as indicated by Y1 and Y2 in FIG. 6D propagates error signals on the SCSI cable 2, which is a large problem in high speed data transfer for large capacity data.

Figure 7:
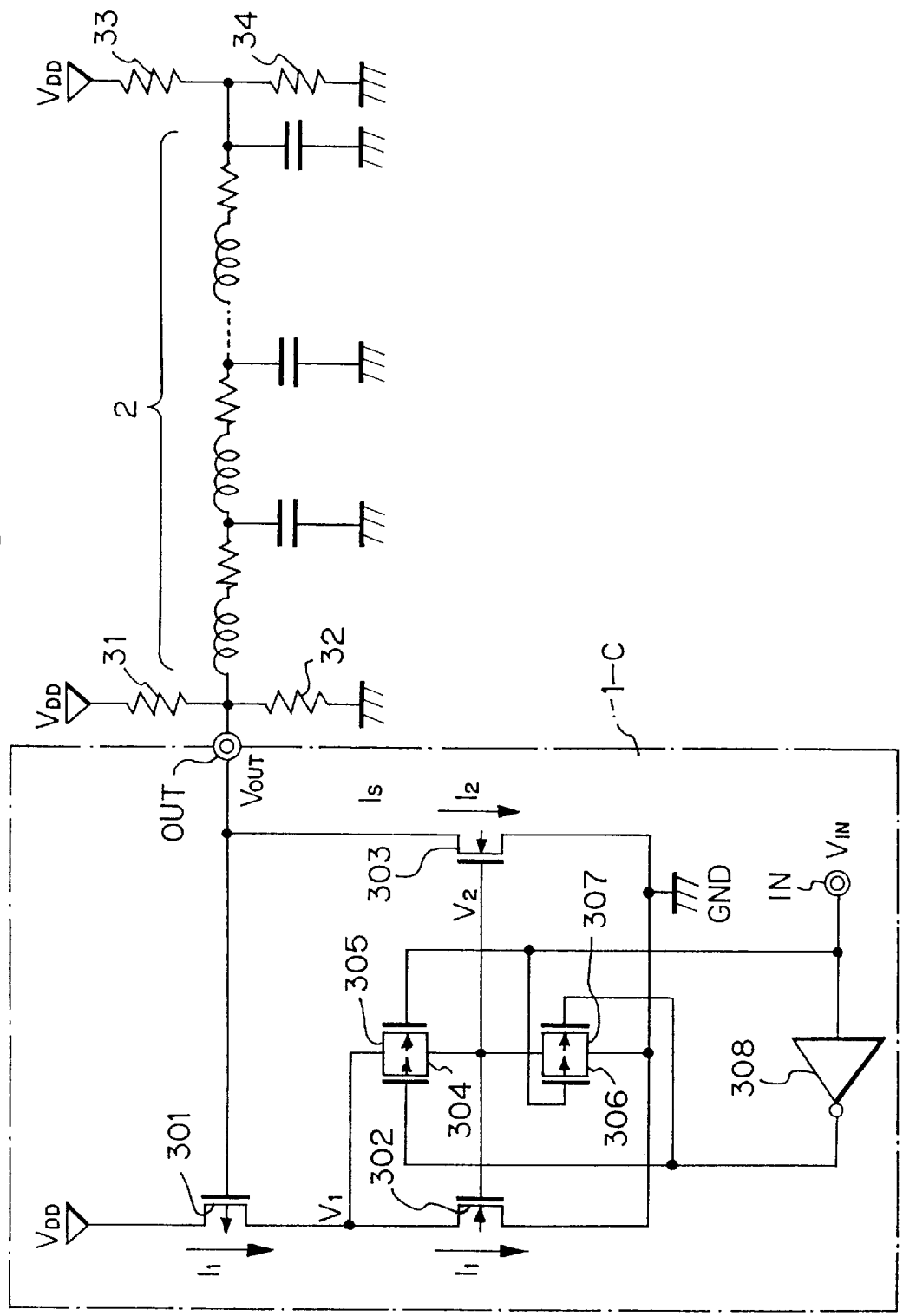
FIG. 7 is a circuit diagram illustrating a first embodiment of the output buffer circuit according to the present invention.

In FIG. 7, which illustrates a first embodiment of the present invention, an open drain type output buffer circuit 1-C corresponding to the output buffer circuit 1-A of FIG. 1 is provided. That is, the output buffer circuit 1-C is comprised of a P-channel MOS transistor 301 having a source connected to the power supply voltage terminal $V_{DD}$ and a gate connected to the output terminal OUT. The transistor 301 converts the output voltage $V_{OUT}$ into a drain current $I_1$.

An N-channel MOS transistor 302 is connected between the drain of the transistor 301 and the ground terminal GND. Also, an N-channel MOS transistor 303 is connected between the output terminal OUT and the ground terminal GND. The gate of the transistor 302 is connected to the gate of the transistor 303, and therefore, the transistors 302 and 303 form a current mirror circuit. Also, the size of the transistor 303 is larger than that of the transistor 302, thus enabling a current amplification. Note that the transistor 303 corresponds to the transistor 101 of FIG. 1.

In order to control the voltages of the gates of the transistors 302 and 303, a transfer gate formed by a P-channel MOS transistor 304 and an N-channel MOS transistor 305 is connected between the drain of the transistor 301 and the gates of the transistors 302 and 303, and a transfer gate formed by a P-channel MOS transistor 306 and an N-channel MOS transistor 307 is connected between the gates of the transistors 302 and 303, and the ground terminal GND.

Also, the transistors 304 and 307 are controlled by an inverted voltage of the input voltage $V_{IN}$ via an inverter 308, while the transistors 305 and 306 are controlled directly by the input voltage $V_{IN}$.

In accordance with the SCSI standard, when the output voltage $V_{OUT}$ at the output terminal OUT is 0.5V, the sink current $I_S$ flowing through the transistor 303 is required to be not smaller 48 mA. For realizing this, the gate width W/gate length L of the transistor 303 is 1440 μm/1 μm. In this case, a drain current $I_2$ of the transistor 303 is calculated by $$I_2 = \beta_N \cdot (W/L) \cdot (V_2 - VTHN - V_{OUT}/2) \cdot V_{OUT}$$

where $\beta_N$ is a current amplification factor such as $5 \times 10^{-5}$;
$V_2$ is a gate-to-source voltage; and
VTHN is a threshold voltage such as 0.7V. Also, the transistor 303 is so designed that the voltage $V_1$ can be increased up to about 4V. For realizing this, for example, the gate width/gate length of the transistor 301 is 36 μm/1 μm, and the gate width/gate length of the transistor 302 is 12 μm/1 μm. In this case, the voltage $V_1$ is about 3.5V when the output voltage $V_{OUT}$ is 0.5V.

Figure 8A:
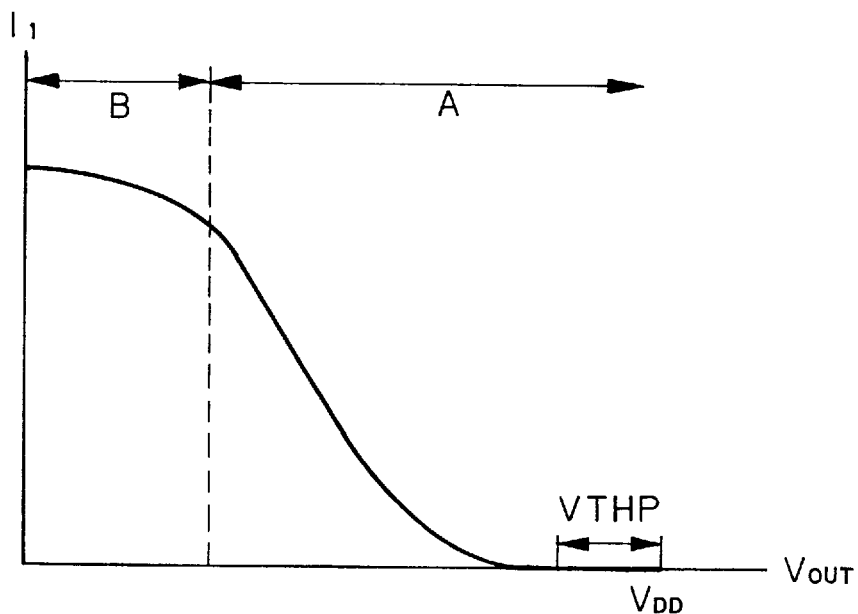
FIG. 8A is a graph showing an example of the output voltage to drain current characteristics of one transistor of FIG. 7.
Figure 8B:
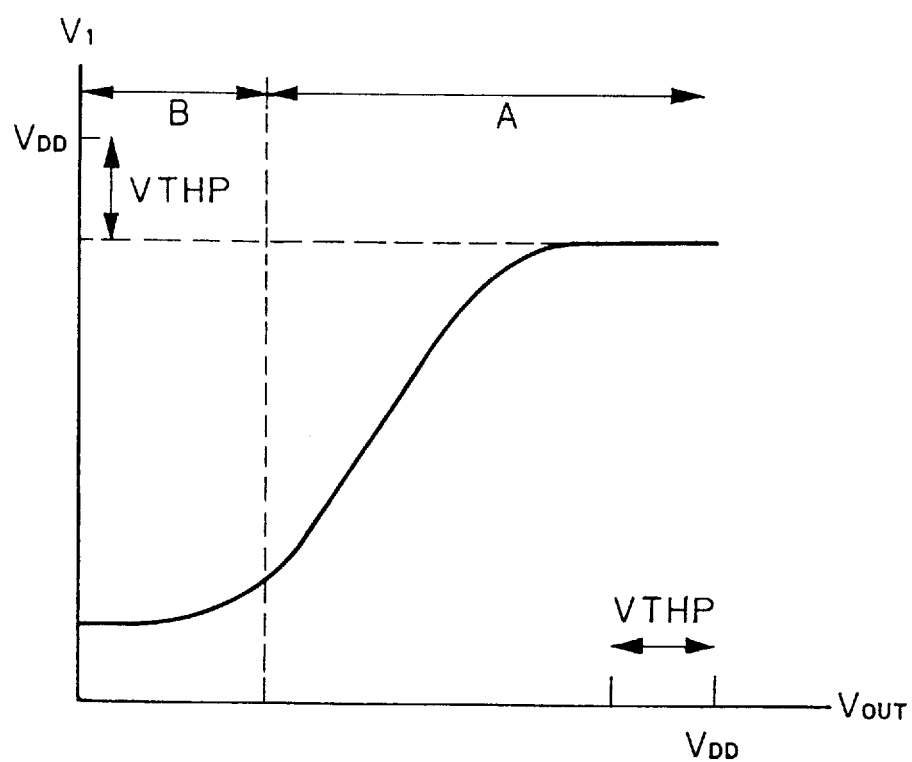
FIG. 8B is a graph showing an example of the output voltage to drain voltage characteristics of the one transistor of FIG. 7.

An example of output voltage to drain current characteristics of the transistor 301 is shown in FIG. 8A, and an example of output voltage to drain voltage characteristics of the transistor 301 is shown in FIG. 8B. Note that VTHP is a threshold voltage of the P-channel transistor 301. That is, in a region A where the output voltage $V_{OUT}$ is relatively high, the drain voltage $V_1$ is in proportion to the output voltage $V_{OUT}$. On the other hand, in a region B where the output voltage $V_{OUT}$ is relatively low, the transistor 301 is in a linear current characteristic region, so that the drain voltage $V_1$ is in proportion to a square root of the output voltage $V_{OUT}$. Thus, the drain current $I_1$ of the transistor 301 represents a transistor square characteristic for the region A, while represents a linear characteristic for the region B.

Figure 9A:
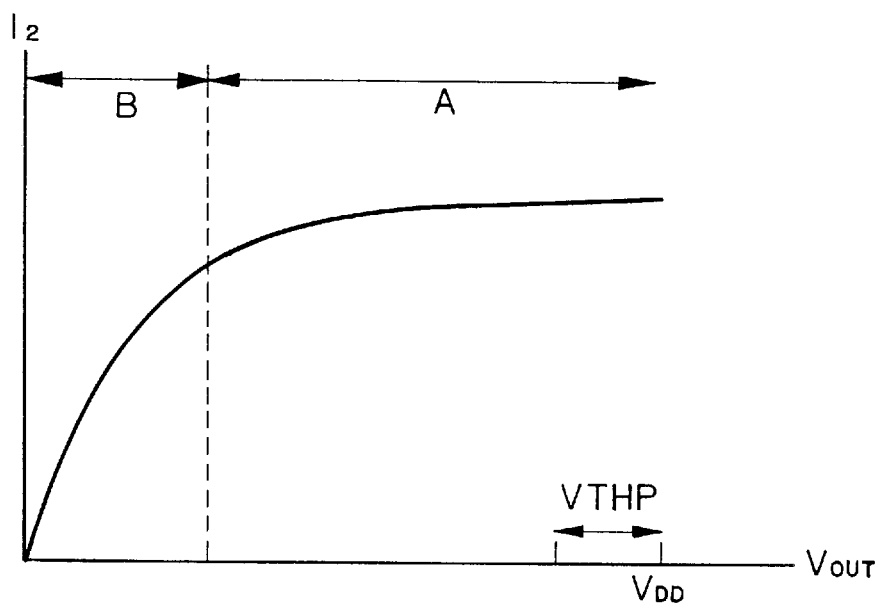
FIG. 9A is a graph showing an example of the output voltage to drain current characteristics of another transistor of FIG. 7.
Figure 9B:
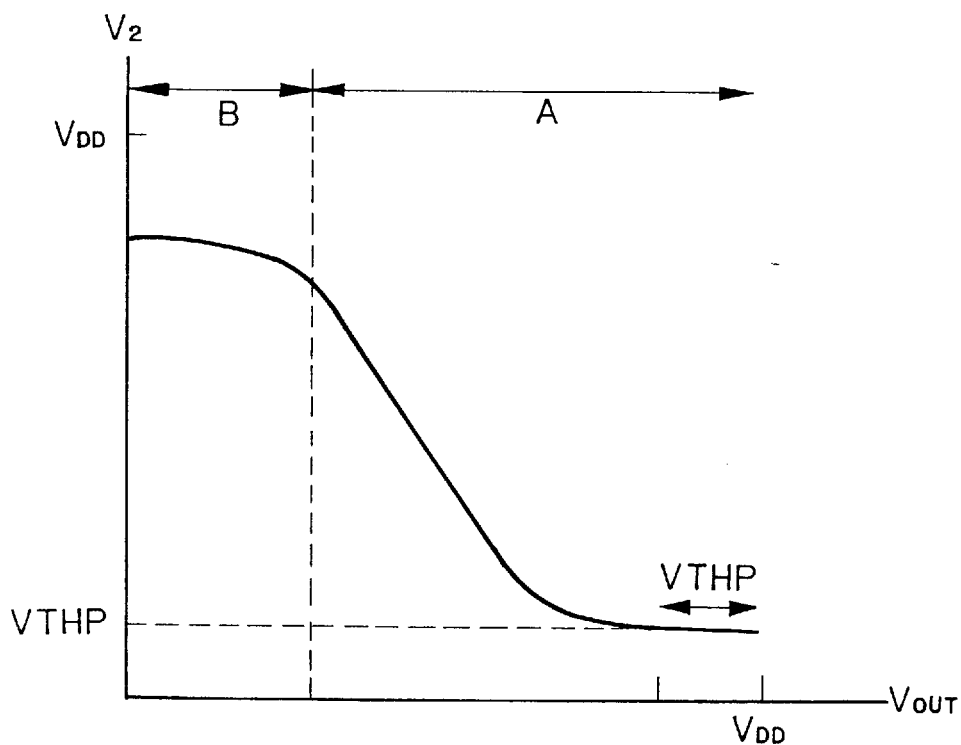
FIG. 9B is a graph showing an example of the output voltage to drain voltage characteristics of the another transistor of FIG. 7.

An example of output voltage to drain current characteristics of the transistor 303 is shown in FIG. 9A, and an example of output voltage to drain voltage characteristics of the transistor 303 is shown in FIG. 9B. That is, in the region A where the output voltage $V_{OUT}$ is relatively high, the drain voltage $V_2$ is inversely proportional to the output voltage $V_{OUT}$. On the other hand, in the region B where the output voltage $V_{OUT}$ is relatively low, the drain voltage $V_2$ is saturated at a value of $V_{DD} - |VTHP|$. Therefore, the drain current $I_2$ represents a linear characteristic for the region B.

Figure 10:
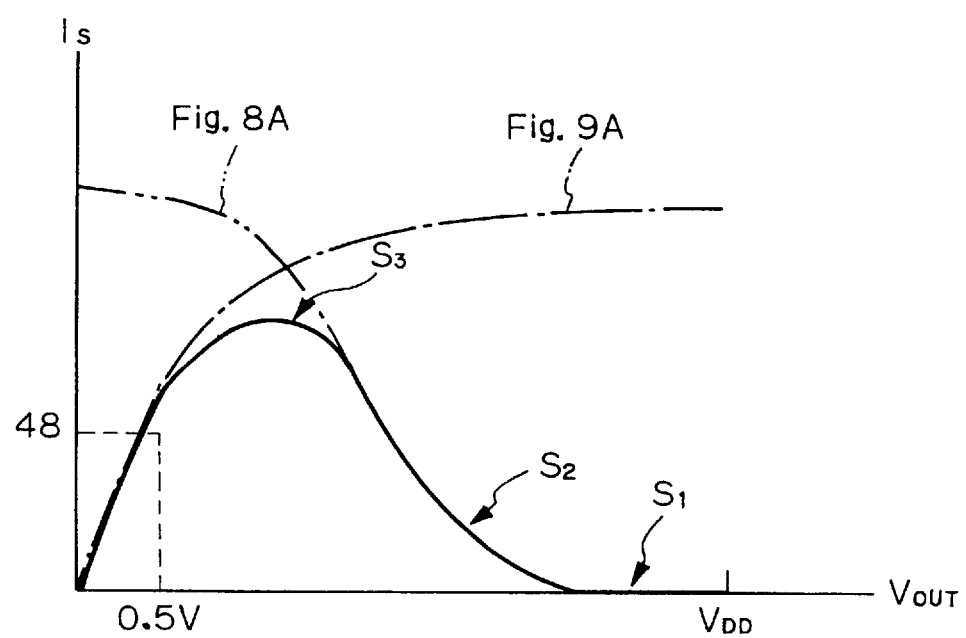
FIG. 10 is a graph showing an example of the output voltage to sink current characteristics of the one transistor of FIG. 7.

When the transfer gate (304, 305) is turned ON and the transfer gate (306, 307) is turned OFF, as shown in FIG. 10, a sink current $I_S$ flowing though the transistor 303 can be represented by a combination of the curve of FIG. 8A and the curve of FIG. 9A.

The operation of the output buffer circuit 1-C of FIG. 7 is explained next with reference to FIGS. 11A, 11B and 11C.

Figure 11A:
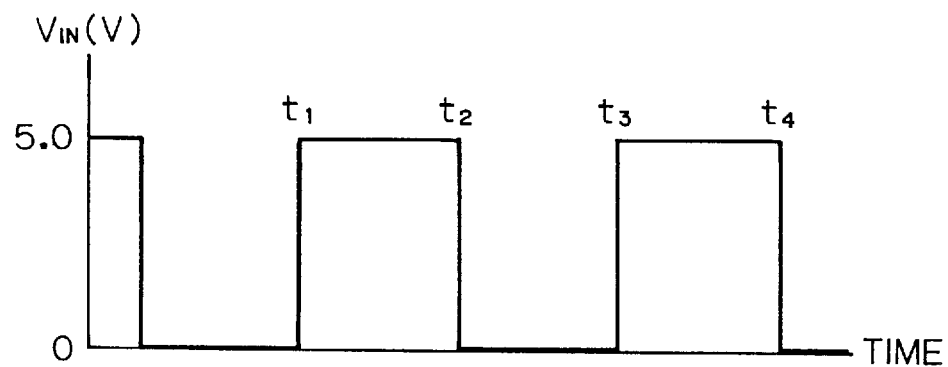
FIGS. 11A, 11B and 11C are graphs showing the operation of the output buffer circuit of FIG. 7.

Note that, before time $t_1, t_3, \ldots$, as shown in FIG. 11A, a slightly lower voltage than $V_{DD}$ determined by the resistors 31 and 32 is applied to the gate of the transistor 301, and therefore, the gate to source voltage of the transistor 301 is not zero. Therefore, a small drain current $I_1$ flows through the transistor 301. This state corresponds to a state $S_1$ of FIGS. 10 and 11B.

Next, at time $t_1, t_3, \ldots$, as shown in FIG. 11A, when the input voltage $V_{IN}$ at the input terminal IN in changed from 0V to 5V, the transfer gate (304, 305) is turned ON and the transfer gate (306, 307) is turned OFF. As a result, the current mirror circuit formed by the transistors 302 and 303 is activated. Therefore, the drain current $I_1$ flowing through the transistor 301, i.e., through the transistor 302 is reflected into the drain current $I_2$ flowing through the transistor 303, which is, in this case, the sink current $I_S$. That is, the sink current $I_S$ is amplified by the amplification factor determined by the transistors 302 and 303. As a result, the output voltage $V_{OUT}$ is reduced which corresponds to a state $S_3$ of FIGS. 10 and 11B.

Figure 11B:
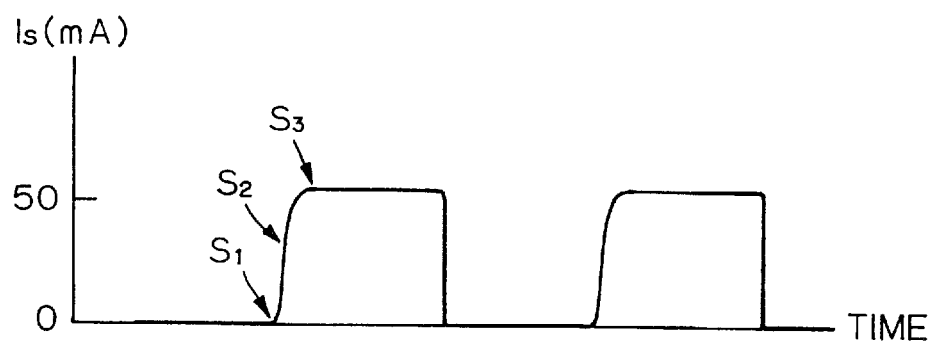

When the output voltage $V_{OUT}$ is reduced, the drain current $I_1$ flowing through the transistors 301 and 302 is further increased, thus entering a positive feedback control for the sink current $I_S$, which corresponds to a state $S_3$ of FIGS. 10 and 11B.

When the sink current $I_S$ is increased by the positive feedback control up to its maximum value, the output voltage $V_{OUT}$ is reduced to 0V.

Thus, as shown in FIG. 11B, no instataneously large current appears in the sink current $I_S$. As a result, the counter electromotive force due to the sink current $I_S$ determined by the formula (2) becomes small.

Figure 11C:
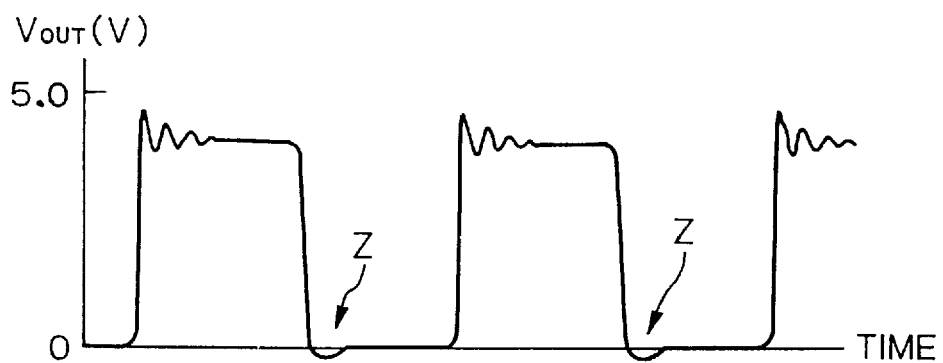

Therefore, as indicated by Z in FIG. 11C, the ringing phenomenon is suppressed in the output voltage $V_{OUT}$.

On the other hand, at time $t_2, t_4, \ldots$, as shown in FIG. 11A, when the input voltage $V_{IN}$ at the input terminal IN in changed from 5V to 0V, the transfer gate (304, 305) is turned OFF and the transfer gate (306, 307) is turned ON. As a result, the current mirror circuit formed by the transistors 302 and 303 is deactivated. Therefore, as shown in FIG. 11B, the sink current $I_S$ does not flow through the transistor 303. As a result, as shown in FIG. 11C, the output voltage $V_{OUT}$ becomes a level determined by the resistors 31 and 32. In this case, the ringing phenomenon is small, the same as in FIG. 3C.

Figure 12:
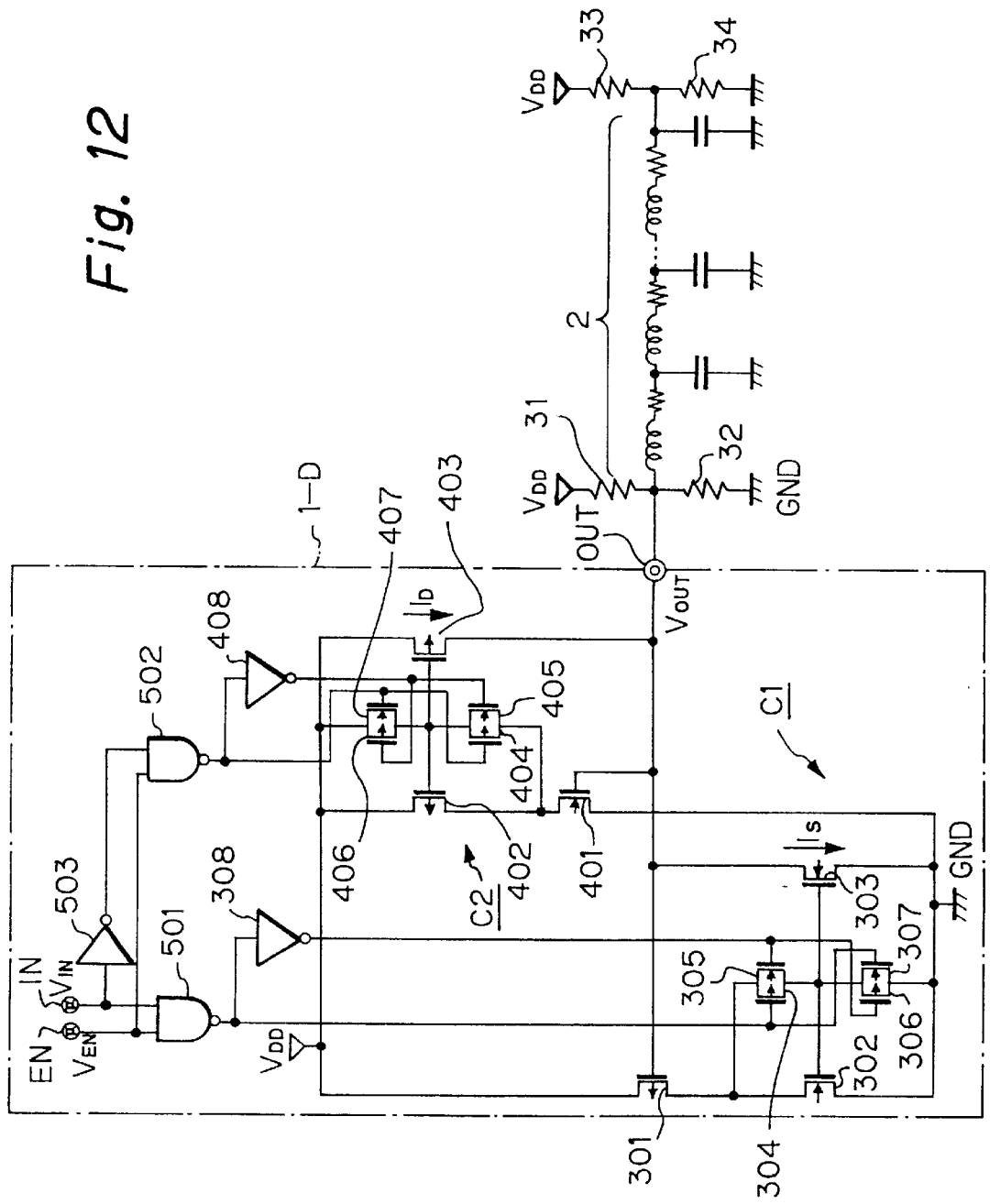
FIG. 12 is a circuit diagram illustrating a second embodiment of the output buffer circuit according to the present invention.

In FIG. 12, which illustrates a second embodiment of the present invention, a tri-state type output buffer circuit 1-D corresponding to the output buffer circuit 1-B of FIG. 4 is provided. That is, a sink current control portion C1 for controlling the sink current $I_S$ and a drive current control portion C2 for controlling the drive current $I_D$ are provided.

The sink current control portion C1 has the same configuration as the output buffer circuit 1-C of FIG. 7, except that the inverter 308 is connected to the transistor 305 and 306.

Also, the drive current control portion C2 has a similar configuration to the output buffer circuit 1-C of FIG. 7.

The drive current control portion C2 is explained next. An N-channel MOS transistor 601 having a source connected to the ground terminal GND and a gate connected to the output terminal OUT. The transistor 601 converts the output voltage $V_{OUT}$ into a drain current thereof.

A P-channel MOS transistor 602 is connected between the drain of the transistor 601 and the power supply terminal $V_{DD}$. Also, a P-channel MOS transistor 603 is connected between the output terminal OUT and the power supply terminal $V_{DD}$. The gate of the transistor 602 is connected to the gate of the transistor 603, and therefore, the transistors 602 and 603 form a current mirror circuit. Also, the size of the transistor 603 is larger than that of the transistor 602, thus enabling a current amplification. Note that the transistor 603 corresponds to the transistor 202 of FIG. 4.

In order to control the voltages of the gates of the transistors 602 and 603, a transfer gate formed by a P-channel MOS transistor 604 and an N-channel MOS transistor 605 is connected between the drain of the transistor 601 and the gates of the transistors 602 and 603, and a transfer gate formed by a P-channel MOS transistor 606 and an N-channel MOS transistor 607 is connected between the gates of the transistors 602 and 603, and the power supply terminal $V_{DD}$.

Also, an inverter 408 is connected to the gates of the transistors 405 and 406.

Further, two NAND circuits 501 and 502 and an inverter 503 are provided between the terminals EN and IN and the portions C1 and C2. That is, when the enable voltage $V_{EN}$ at the enable terminal EN is 5V, the transistors 304, 307, 405 and 406 are controlled by an inverted voltage of the input voltage $V_{IN}$, while the transistors 305, 306, 404 and 407 are controlled by the input voltage $V_{IN}$.

In accordance with the SCSI standard, when the output voltage $V_{OUT}$ at the output terminal OUT is $V_{DD}$–0.5V, the drive current $I_D$ flowing through the transistor 403 is required to be relatively large. For realizing this, the gate width/gate length of the transistor 403 is 360 μm/1 μm. Also, in order to obtain an amplification of the current mirror circuit, the gate width/gate length of the transistor 402 is 12 μm/1 μm. Further, the gate width/gate length of the transistor 401 is 18 μm/1 μm.

Figure 13A:
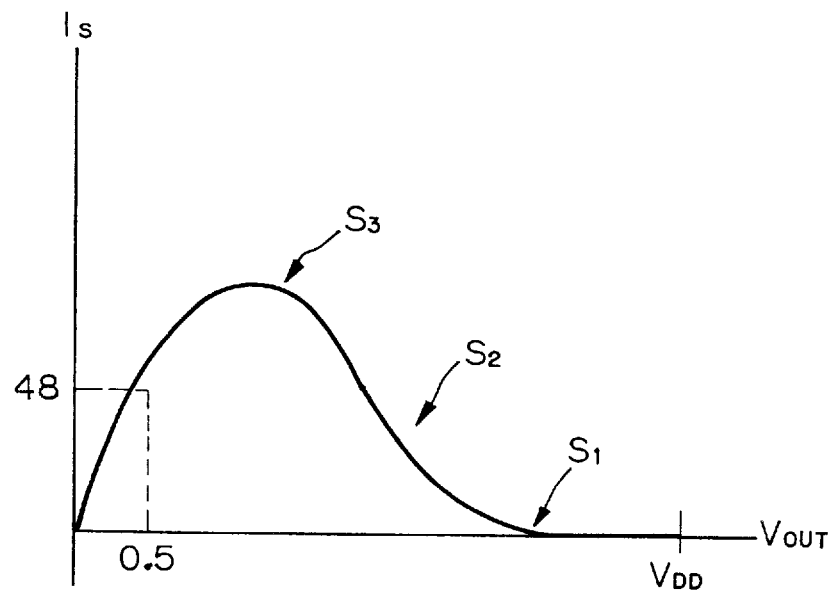
FIG. 13A is a graph showing an example of the output voltage to sink current characteristics of the transistor of FIG. 12.
Figure 13B:
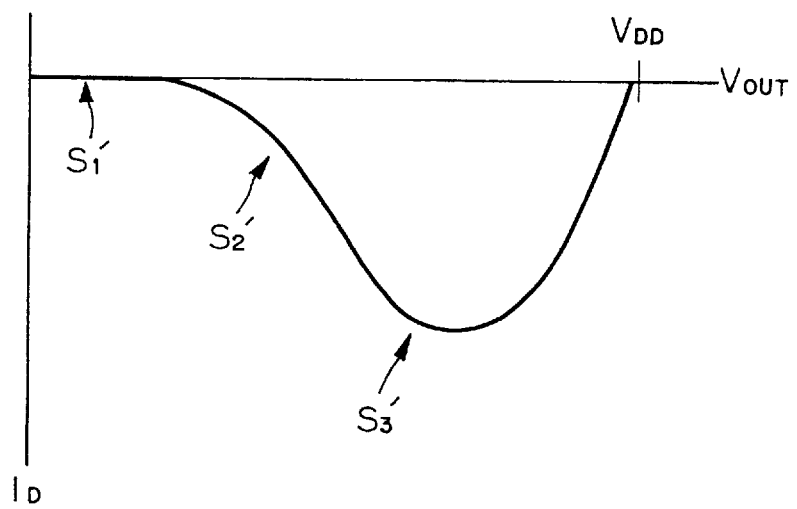
FIG. 13B is a graph showing an example of the output voltage to drive current characteristics of the transistor of FIG. 12.

When the transfer gate (304, 305) is turned ON and the transfer gate (306, 307) is turned OFF, the characteristics of the output voltage $V_{OUT}$ to the sink current $I_S$ are as shown in FIG. 13A which is the same as FIG. 10. On the other hand, when the transfer gate (404, 405) is turned ON and the transfer gate (406, 407) is turned OFF, the characteristics of the output voltage $V_{OUT}$ to the drive current $I_D$ are as shown in FIG. 13B.

Figure 14A:
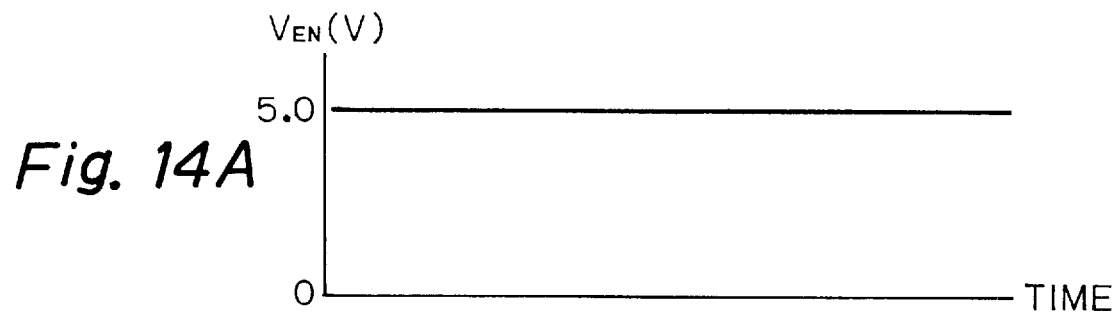
FIGS. 14A, 14B, 14C and 14D are graphs showing the operation of the output buffer circuit of FIG. 12.
Figure 14B:
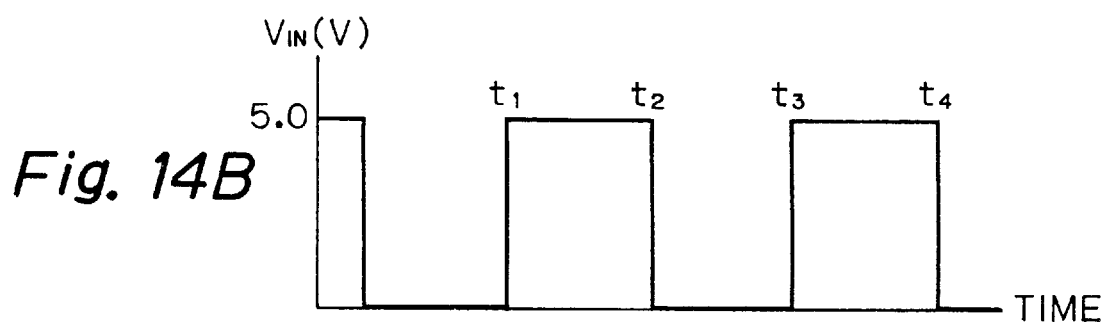

The operation of the output buffer circuit 1-D of FIG. 12 is explained next with reference to FIGS. 14A, 14B, 14C and 13D. Note that the enable voltage $V_{EN}$ at the enable terminal EN is 5V as shown in FIG. 14A. Also, before time $t_1$, $t_3$, . . . , as shown in FIG. 14B, a slightly lower voltage than $V_{DD}$ determined by the resistors 31 and 32 is applied to the gate of the transistor 301, and therefore, the gate to source voltage of the transistor 301 is not zero. Therefore, a small drain current flows through the transistor 301. This state corresponds to a state $S_1$ of FIGS. 13A and 14C.

Next, at time $t_1$, $t_3$, . . . , as shown in FIG. 14B, when the input voltage $V_{IN}$ at the input terminal IN is changed from 0V to 5V, the sink current control portion C1 is activated and the drive current control portion C2 is deactivated.

That is, the transfer gate (304, 305) is turned ON and the transfer gate (306, 307) is turned OFF. As a result, the current mirror circuit formed by the transistors 302 and 303 is activated. Therefore, the drain current flowing through the transistor 301, i.e., through the transistor 302 is reflected into the sink current $I_S$. That is, the sink current $I_S$ is amplified by the amplification factor determined by the transistors 302 and 303. As a result, the output voltage $V_{OUT}$ is reduced which corresponds to a state $S_2$ of FIGS. 13A and 14C.

Figure 14C:
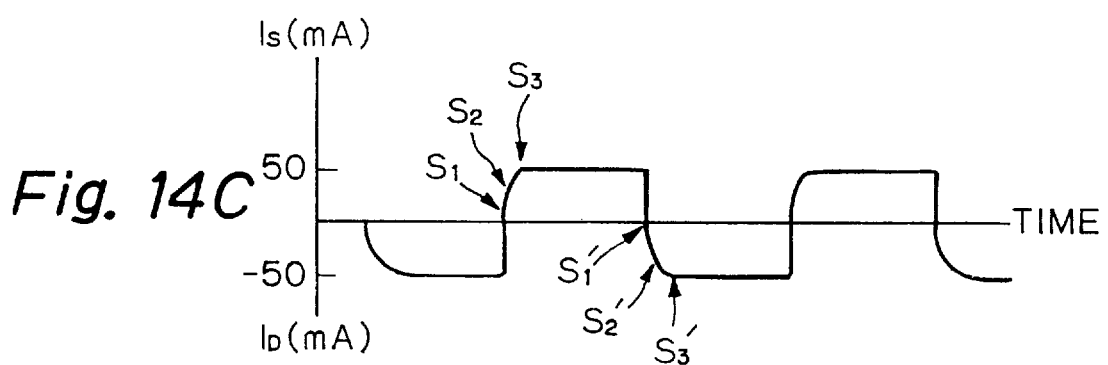

When the output voltage $V_{OUT}$ is reduced, the drain current flowing through the transistors 301 and 302 is further increased, thus entering a positive feedback control for the sink current $I_S$, which corresponds to a state $S_3$ of FIGS. 13A and 14C.

When the sink current $I_S$ is increased by the positive feedback control up to its maximum value, the output voltage $V_{OUT}$ reduced to 0V.

Thus, as shown in FIG. 14C, no instantaneously large current appears in the sink current $I_S$. As a result, the counter electromotive force due to the sink current $I_S$ determined by the formula (2) becomes small.

Figure 14D:
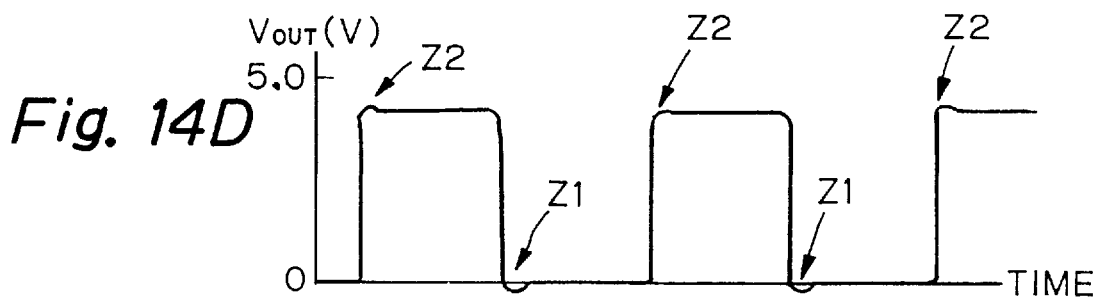

Therefore, as indicated by Z1 in FIG. 14D, the ringing phenomenon is suppressed in the output voltage $V_{OUT}$.

On the other hand, in the drive current control portion C2, the transfer gate (404, 405) is turned OFF and the transfer gate (406, 407) is turned ON. As a result, the current mirror circuit formed by the transistors 402 and 403 is deactivated. Therefore, the drive current $I_D$ does not flow through the transistor 403.

Note that before time $t_2$, $t_4$, . . . , as shown in FIG. 14B, a slightly higher voltage than 0V determined by the resistors 31 and 32 is applied to the gate of the transistor 401, and therefore, the gate to source voltage of the transistor 401 is not zero. Therefore, a small drain current flows through the transistor 401. This state corresponds to a state $S_1'$ of FIGS. 13B and 14C.

Next, at time $t_2$, $t_4$, . . . , as shown in FIG. 14B, when the input voltage $V_{IN}$ at the input terminal IN in changed from 5V to 0V, the drive current control portion C2 is activated and the sink current control portion C1 is deactivated.

That is, the transfer gate (404, 405) is turned ON and the transfer gate (406, 407) is turned OFF. As a result, the current mirror circuit formed by the transistors 402 and 403 is activated. Therefore, the drain current flowing through the transistor 401, i.e., through the transistor 402 is reflected into the drive current $I_D$. That is, the drive current $I_D$ is amplified by the amplification factor determined by the transistors 402 and 403. As a result, the output voltage $V_{OUT}$ is increased which corresponds to a state $S_2'$ of FIGS. 13B and 14C.

When the output voltage $V_{OUT}$ is increased, the drain current flowing through the transistors 401 and 402 is further increased, thus entering a positive feedback control for the drive current $I_D$, which corresponds to a state $S_3'$ of FIGS. 13B and 14C.

When the drive current $I_D$ is increased by the positive feedback control up to its maximum value, the output voltage $V_{OUT}$ is increased to $V_{DD}-|VTHP|$.

When the output voltage $V_{OUT}$ is further increased, the drain to source voltage of the transistor 403 is remarkably reduced. As a result, the drive current $I_D$ is reduced as the output voltage $V_{OUT}$ is increased. This corresponds to a state $S_4'$ of FIGS. 13B and 14C.

Thus, as shown in FIG. 14C, no instantaneously large current appears in the drive current $I_D$. As a result, the counter electromotive force due to the drive current $I_D$ determined by the formula (2) becomes small.

Therefore, as indicated by Z2 in FIG. 14D, the ringing phenomenon is suppressed in the output voltage $V_{OUT}$.

On the other hand, in the sink current control portion C1, the transfer gate (304, 305) is turned OFF and the transfer gate (306, 307) is turned ON. As a result, the current mirror circuit formed by the transistors 302 and 303 is deactivated. Therefore, the sink current $I_S$ does not flow through the transistor 303.

Note that, when the enable voltage $V_{EN}$ at the enable terminal EN is 0V, the NAND circuits 501 and 502 are deactivated in spite of the input voltage $V_{IN}$. As a result, in the sink current control portion C1, the transfer gate (306, 307) is turned ON, and the transfer gate (304, 305) is turned OFF, so that the current mirror circuit formed by the transistors 302 and 303 is not operated. Simultaneously, in the sink current control portion C2, the transfer gate (406, 407) is turned ON, and the transfer gate (404, 405) is turned OFF, so that the current mirror circuit formed by the transistors 402 and 403 is not operated. Thus, the output terminal OUT is in a high impedance state, and the output voltage $V_{OUT}$ is determined by the resistors 31 and 32.

As explained hereinabove, since the ringing phenomenon can be suppressed in the output voltage of the output buffer circuit, high speed data transfer for large capacity data can be possible by a SCSI cable.

I claim:

1. An output buffer circuit comprising:

an input terminal;

an output terminal;

first and second power supply terminals;

a voltage-to-current conversion means, connected to said output terminal, and said first power supply terminal, for converting a voltage at said output terminal into a first current supplied from said first power supply terminal;

a current-to-current conversion means, connected to said voltage-to-current conversion means, said output terminal and said second power supply terminal, for converting said first current into a second current flowing between said output terminal and said second power supply terminal; and a control circuit, connected to said input terminal and said current-to-current conversion means, for turning ON and OFF said current-to-current conversion means in accordance with an input voltage at said input terminal.

2. The output buffer circuit as set forth in claim 1, wherein said voltage-to-current conversion means comprises a first transistor of a first conductivity type having a source connected to said first power supply terminal, a gate connected to said output terminal, and a drain, said current-to-current conversion means comprising:
a second transistor of a second conductivity type opposite to said first conductivity type, having a drain connected to the drain of said first transistor, a source connected to said second power supply terminal, and a gate; and
a third transistor of said second conductivity type, having a drain connected to said output terminal, a source connected to said second power supply terminal, and a gate connected to the gate of said second transistor.

3. The output buffer circuit as set forth in claim 2, wherein a gate width/gate length of said third transistor is larger than a gate width/gate length of said second transistor.

4. The output buffer circuit as set forth in claim 2, wherein said control circuit comprises:
a first transfer gate connected between the drains of said first and second transistors and the gates of said second and third transistors; and
a second transfer gate connected between the gates of said second and third transistors and said second power supply terminal,
one of said first and second transfer gates being turned ON and the other of said first and second transfer gates being turned OFF in accordance with said input voltage.

5. An output buffer circuit comprising:
an input terminal;
an output terminal;
first and second power supply terminals;
a first voltage-to-current conversion means, connected to said output terminal and said first power supply terminal, for converting a voltage at said output terminal into a first current supplied from said first power supply terminal;
a first current-to-current conversion means, connected to said first voltage-to-current conversion means, said output terminal and said second power supply terminal, for converting said first current into a second current flowing between said output terminal and said second power supply terminal;
a first control circuit, connected operatively to said input terminal and said first current-to-current conversion means, for turning ON and OFF said first current-to-current conversion means in accordance with an input voltage at said input terminal;
a second voltage-to-current conversion means, connected to said output terminal, and said second power supply terminal, for converting the voltage at said output terminal into a third current supplied from said second power supply terminal;
a second current-to-current conversion means, connected to said second voltage-to-current conversion means, said output terminal and said first power supply terminal, for converting said third current into a fourth current flowing between said output terminal and said first power supply terminal; and
a second control circuit, connected operatively to said input terminal and said second current-to-current conversion means, for turning ON and OFF said second current-to-current conversion means in accordance with said input voltage,
one of said first and second current-to-current conversion means being turned ON when the other of said first and second current-to-current conversion means is turned OFF.

6. The output buffer circuit as set forth in claim 5, wherein said first voltage-to-current conversion means comprises a first transistor of a first conductivity type having a source connected to said first power supply terminal, a gate connected to said output terminal, and a drain, said first current-to-current conversion means comprising:
a second transistor of a second conductivity type opposite to said first conductivity type, having a drain connected to the drain of said first transistor, a source connected to said second power supply terminal, and a gate; and
a third transistor of said second conductivity type, having a drain connected to said output terminal, a source connected to said second power supply terminal, and a gate connected to the gate of said second transistor,
said second voltage-to-current conversion means comprising a fourth transistor of said second conductivity type having a source connected to said second power supply terminal, a gate connected to said output terminal, and a drain,
said second current-to-current conversion means comprising:
a fifth transistor of said first conductivity type having a drain connected to the drain of said fourth transistor, a source connected to said first power supply terminal, and a gate; and
a sixth transistor of said first conductivity type, having a drain connected to said output terminal, a source connected to said first power supply terminal, and a gate connected to the gate of said fifth transistor.

7. The output buffer circuit as set forth in claim 6, wherein a gate width/gate length of said third transistor is larger than a gate width/gate length of said second transistor,
a gate width/gate length of said sixth transistor being larger than a gate width/gate length of said fifth transistor.

8. The output buffer circuit as set forth in claim 6, wherein said first control circuit comprises:
a first transfer gate connected between the drains of said first and second transistors and the gates of said second and third transistors; and
a second transfer gate connected between the gates of said second and third transistors and said second power supply terminal,
said second control circuit comprising:
a third transfer gate connected between the drains of said fourth and fifth transistors and the gates of said fifth and sixth transistors; and
a fourth transfer gate connected between the gates of said fifth and sixth transistors and said first power supply terminal,
said first and fourth transfer gates being turned ON when said second and third transfer gate are turned OFF in accordance with said input voltage,
said second and third transfer gates being turned ON when said first and fourth transfer gate are turned OFF in accordance with said input voltage.

* * * * *